(12) United States Patent
Hashimoto et al.

(10) Patent No.: US 8,253,221 B2
(45) Date of Patent: Aug. 28, 2012

(54) GALLIUM NITRIDE BULK CRYSTALS AND THEIR GROWTH METHOD

(75) Inventors: Tadao Hashimoto, Santa Barbara, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 879 days.

(21) Appl. No.: 12/234,244

(22) Filed: Sep. 19, 2008

(65) Prior Publication Data

US 2009/0072352 A1 Mar. 19, 2009

Related U.S. Application Data

(60) Provisional application No. 60/973,662, filed on Sep. 19, 2007.

(51) Int. Cl.
*H01L 29/20* (2006.01)
(52) U.S. Cl. ............... 257/615; 257/E21.697; 438/604; 423/409
(58) Field of Classification Search ................. 257/615, 257/E21.697; 438/604; 423/409
See application file for complete search history.

(56) References Cited

U.S. PATENT DOCUMENTS

| | | |
|---|---|---|
| 6,177,057 B1 | 1/2001 | Purdy |
| 6,316,785 B1 | 11/2001 | Nunoue et al. |
| 6,398,867 B1 | 6/2002 | D'Evelyn et al. |
| 6,656,615 B2 | 12/2003 | Dwilinski et al. |
| 7,078,731 B2 | 7/2006 | D'Evelyn et al. |
| 2002/0144645 A1 | 10/2002 | Kim et al. |
| 2003/0024475 A1 | 2/2003 | Anderson |
| 2004/0226588 A1 | 11/2004 | Onishi et al. |
| 2005/0142391 A1 | 6/2005 | Dmitriev et al. |
| 2005/0161697 A1 | 7/2005 | Nakahata et al. |
| 2005/0258451 A1 | 11/2005 | Saxler et al. |
| 2007/0084399 A1 | 4/2007 | Sarayama et al. |
| 2007/0158785 A1 | 7/2007 | D'Evelyn et al. |

OTHER PUBLICATIONS

Aoki, M. et al., "GaN single crystal growth using high-purity Na as a flux," Journal of Crystal Growth 242, 2002, pp. 70-76.
Dwilinski, R. et al., "AMMONO method of BN, AlN and GaN synthesis and crystal growth," MRS Internet J. Nitride Semicond. Res. 3, 25, 1998, pp. 1-4.
Dwilinski, R. et al., "AMMONO method of GaN and AlN production," Diamond and Related Materials 7, 1998, pp. 1348-1350.

(Continued)

*Primary Examiner* — Matthew Landau
*Assistant Examiner* — Colleen E Snow
(74) *Attorney, Agent, or Firm* — Gates & Cooper LLP

(57) ABSTRACT

A gallium nitride crystal with a polyhedron shape having exposed {10-10} m-planes and an exposed (000-1) N-polar c-plane, wherein a surface area of the exposed (000-1) N-polar c-plane is more than 10 mm$^2$ and a total surface area of the exposed {10-10} m-planes is larger than half of the surface area of (000-1) N-polar c-plane. The GaN bulk crystals were grown by an ammonothermal method with a higher temperature and temperature difference than is used conventionally, and using an autoclave having a high-pressure vessel with an upper region and a lower region. The temperature of the lower region of the high-pressure vessel is at or above 550° C., the temperature of the upper region of the high-pressure vessel is set at or above 500° C., and the temperature difference between the lower and upper regions is maintained at or above 30° C. GaN seed crystals having a longest dimension along the c-axis and exposed large area m-planes are used.

13 Claims, 8 Drawing Sheets

OTHER PUBLICATIONS

Inoue, T. et al., "Pressure-controlled solution growth of bulk GaN crystals under high pressure," Phys. Stat. Sol. (b) 223, 15, 2001, pp. 15-27.

Iwahashi, T. et al., "Effects of ammonia gas on threshold pressure and see growth for bulk GaN single crystals by Na flux method," Journal of Crystal Growth 253, 2003, pp. 1-5.

Ketchum, D. et al., "Crystal growth of gallium nitride in supercritical ammonia," Journal of Crystal Growth 222, 2001, pp. 431-434.

Peters, D., "Ammonothermal synthesis of aluminum nitride," Journal of Crystal Growth 104, 1990, pp. 411-418.

Porowski, S., "Near defect free GaN substrates," MRS Internet Journal of Nitride Semiconductor, Res. 4S1, 1999, 11 pages.

Shao, Y-P. et al., "Elextrical Characterization of Semipolar Gallium Nitride Thin Films," NNIN REU Research Accomplishments, Aug. 2005, pp. 132-133.

PCT/US2008/77056 International Search Report and Written Opinion, Mailing date Dec. 8, 2008.

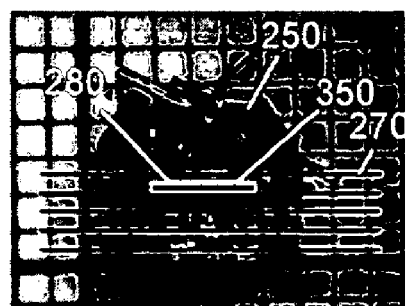
*Fig. 5(a)*
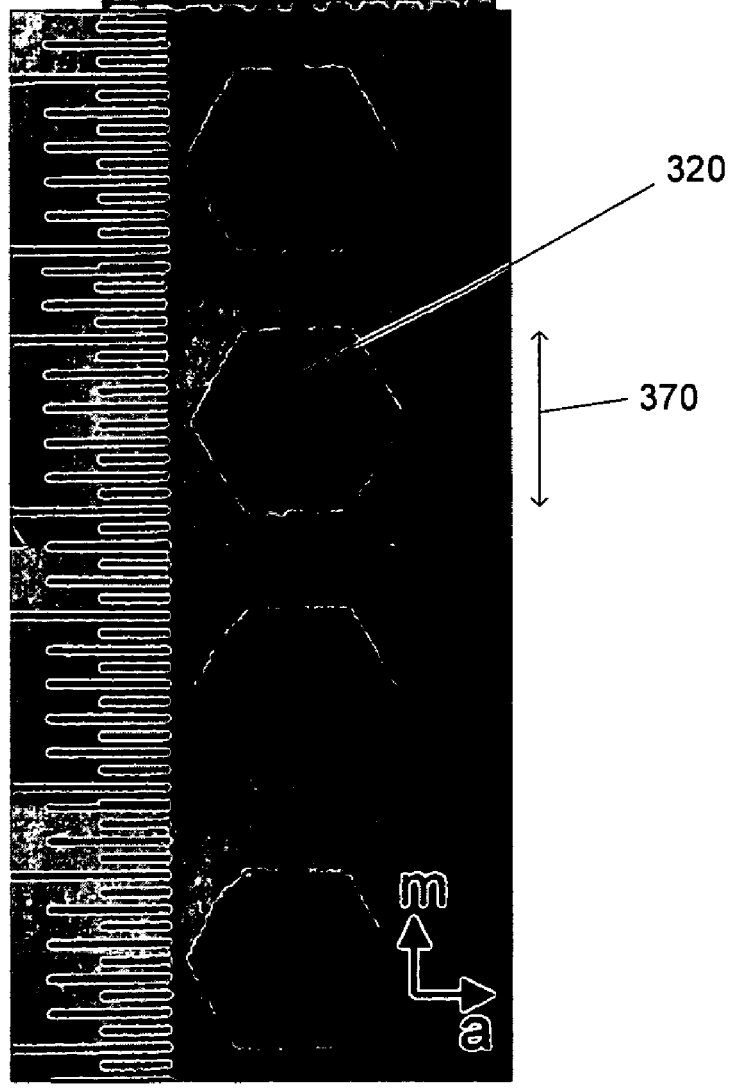
*Fig. 5(b)*
*Fig. 5(c)*
*Fig. 5(d)*
*Fig. 5(e)*

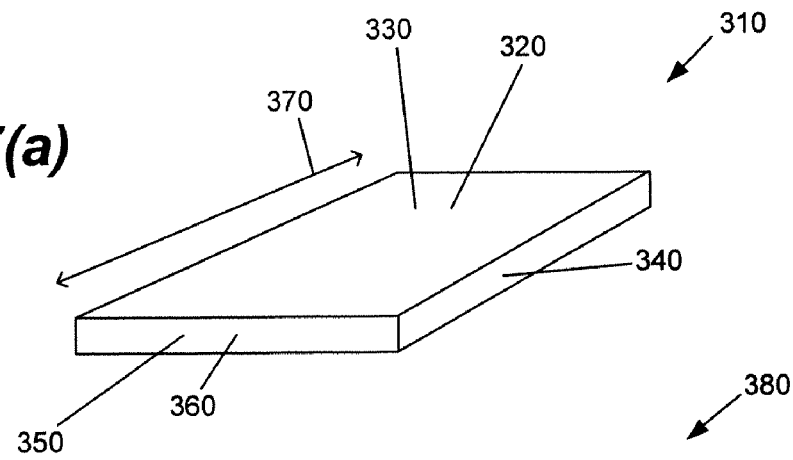
Fig. 7(a)
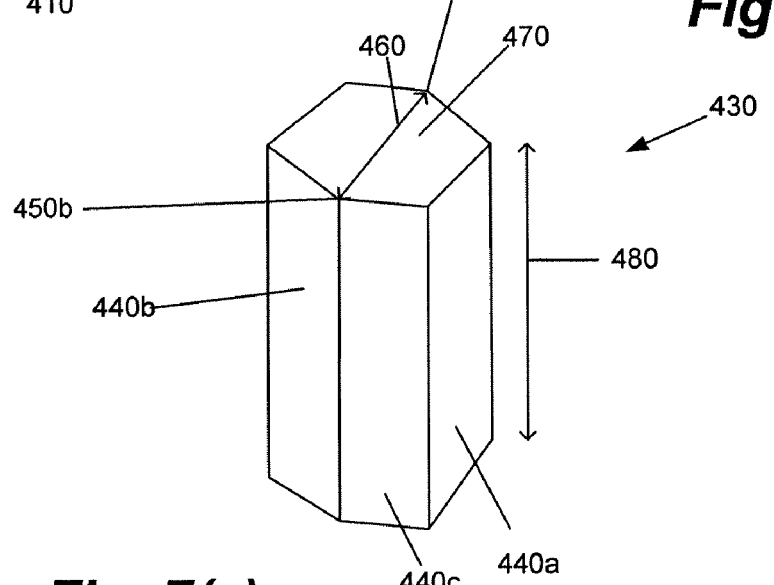
Fig. 7(b)
Fig. 7(c)

GALLIUM NITRIDE BULK CRYSTALS AND THEIR GROWTH METHOD

CROSS REFERENCE TO RELATED APPLICATIONS

This application claims the benefit under 35 U.S.C. Section 119(e) of co-pending and commonly-assigned U.S. Provisional Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD," which application is incorporated by reference herein.

This application is related to the following co-pending and commonly-assigned U.S. patent applications:

U.S. Utility patent application Ser. No. 11/921,396, filed on Nov. 30, 2007, by Kenji Fujito, Tadao Hashimoto and Shuji Nakamura, entitled "METHOD FOR GROWING GROUP-III NITRIDE CRYSTALS IN SUPERCRITICAL AMMONIA USING AN AUTOCLAVE," which application claims the benefit under 35 U.S.C. Section 365(c) of PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility patent application Ser. No. 11/765,629, filed on Jun. 20, 2007, by Tadao Hashimoto, Hitoshi Sato and Shuji Nakamura, entitled "OPTO-ELECTRONIC AND ELECTRONIC DEVICES USING N-FACE OR M-PLANE GaN SUBSTRATE PREPARED WITH AMMONOTHERMAL GROWTH," now U.S. Pat. No. 7,755,172, issued Jul. 13, 2010, application claims the benefit under 35 U.S.C. Section 119(e) of U.S. Provisional Application Ser. No. 60/815,507, filed on Jun. 21, 2006, by Tadao Hashimoto, Hitoshi Sato, and Shuji Nakamura, entitled "OPTO-ELECTRONIC AND ELECTRONIC DEVICES USING N-FACE GaN SUBSTRATE PREPARED WITH AMMONOTHERMAL GROWTH,"; and U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY," now U.S. Pat. No. 7,803,344, issued Sep. 28, 2010, which application claims the benefit under 35 U.S.C. Section 119(e) of U.S. Provisional Application Ser. No. 60/854,567, filed on Oct. 25, 2006, by Tadao Hashimoto, entitled "METHOD FOR GROWING GROUP-III NITRIDE CRYSTALS IN MIXTURE OF SUPERCRITICAL AMMONIA AND NITROGEN AND GROUP-III NITRIDE CRYSTALS,";

which applications are incorporated by reference herein.

BACKGROUND OF THE INVENTION

1. Field of the Invention

This invention relates to gallium nitride bulk crystals and methods for making the same.

2. Description of the Related Art (Note: This application references a number of different publications as indicated throughout the specification by one or more reference numbers within brackets, e.g., [Ref. x]. A list of these different publications ordered according to these reference numbers can be found below in the section entitled "References." Each of these publications is incorporated by reference herein.)

The usefulness of gallium nitride (GaN), and its ternary and quaternary alloys incorporating aluminum and indium (AlGaN, InGaN, AlInGaN), has been well established for fabrication of visible and ultraviolet optoelectronic devices and high-power electronic devices. These devices are typically grown epitaxially on heterogeneous substrates, such as sapphire and silicon carbide, since GaN wafers are very expensive. The heteroepitaxial growth of group III-nitride causes highly defected or even cracked films, which deteriorate the performance and reliability of these devices.

In order to eliminate the problems arising from the heteroepitaxial growth, GaN wafers sliced from bulk GaN crystals must be used. However, it is very difficult to grow a bulk crystal of GaN, since GaN has a high melting point and high nitrogen vapor pressure at high temperature.

Up to now, a few methods such as high-pressure high-temperature synthesis [Ref. 1, 2] and a sodium flux method [Ref. 3, 4] have been used to obtain bulk group III-nitride crystals. However, the crystal shape obtained by these methods is a thin platelet because these methods are based on a Ga melt, in which nitrogen has very low solubility and a low diffusion coefficient.

A new technique is based on supercritical ammonia, which has high solubility of source materials, such as polycrystalline GaN or Ga metal, and which has high transport speed of dissolved precursors. This ammonothermal method [Ref. 5-9] has a potential for growing large GaN crystals. However, existing technology is limited by the crystal size, because the growth rate is not fast enough to obtain large crystals.

SUMMARY OF THE INVENTION

The present invention discloses a gallium nitride (GaN) bulk crystal having a polyhedron shape which could not be obtained using existing growth methods. The shape of the GaN bulk crystals has an advantage over the existing platelet-shaped GaN, since GaN wafers of any preferable orientations can be obtained simply by slicing the polyhedron. The GaN bulk crystals have exposed {10-10} m-planes and an exposed (000-1) N-polar c-plane, wherein the surface area of the exposed (000-1) N-polar c-plane is more than 10 mm$^2$ and the total surface area of the exposed {10-10} m-planes is larger than half of the surface area of (000-1) N-polar c-plane.

The GaN bulk crystals were grown by the ammonothermal method. A high-pressure vessel made of Ni—Cr based superalloy, having a longest dimension along the vertical direction, is used to contain high-pressure ammonia at temperatures above 500° C. The high-pressure vessel is equipped with baffle plates which divide the inner room of the high-pressure vessel into two regions along the longitudinal direction of the high-pressure vessel, noted as an upper region and a lower region. The Ga-containing source materials, such as polycrystalline GaN or Ga metal, are placed in the upper region and seed crystals, such as single crystal GaN, are placed in the lower region. To increase the growth rate, an alkali-base mineralizer such as $KNH_2$, $NaNH_2$, $LiNH_2$, K, Na, Li, $Ca(NH_2)_2$, $Mg(NH_2)_2$, $Ba(NH_2)_2$, $Ca_3N_2$, $Mg_3N_2$, $MgCl_2$, $CaCl_2$, $MgBr_2$, $CaBr_2$, $MgI_2$, $CaI_2$, Mg, Ca, or similar alkali metal, alkali earth metal containing substance is added. The high-pressure vessel is filled with ammonia, sealed, and is heated from the outside by multi-zone heaters to set a temperature difference between the upper region and the lower region. The polyhedron-shaped GaN crystals were grown by setting the temperature for the lower region (crystallization region) to be at or above 550° C., the temperature for the upper region (dissolution region) to be at or above 500° C., and the temperature difference between the upper and lower regions to be at or above 30° C. These temperatures are typically maintained for more than 30 days. Then, typically, the high pressure ammonia may be released at a temperature higher than 300° C., the vessel may be unsealed at a temperature higher than 300° C., and the vessel may be cooled.

Although platelet-shaped crystals can be used as seeds, rod-shaped GaN crystal seeds are preferable for avoiding multiple grain structure of the GaN polyhedron. For example, the crystal may be grown on a seed crystal, wherein the seed crystal is an a-plane oriented gallium nitride wafer, an m-plane oriented gallium nitride wafer, or a c-plane oriented gallium nitride wafer. The a-plane oriented seed crystal may be obtained by slicing a GaN boule grown by an ammonothermal method. The crystal may be grown on a rod-shaped GaN crystal having its longest dimension along a c-axis. A GaN wafer may be sliced from the grown bulk crystal obtained using the present invention.

BRIEF DESCRIPTION OF THE DRAWINGS

Referring now to the drawings in which like reference numbers represent corresponding parts throughout:

FIG. 5(a) is a side view of a GaN boule before slicing, wherein the parallel lines and rectangle represent approximate wire saw position and position of seed crystal, respectively, and FIGS. 5(b)-(e) are photographs of c-plane GaN wafers sliced from the GaN boule shown in FIG. 5(a), wherein the minimum graduation of the scale shown in FIGS. 5(b)-(e) is a half millimeter.

FIGS. 7(a)-(c) are schematic cross-sections of examples of seed crystals used in the present invention.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

The present invention describes a GaN wafer that is obtained by slicing a polyhedron-shaped GaN crystal along any of a number of different preferable orientations. The polyhedron-shaped GaN bulk crystal has exposed {10-10} m-planes and an exposed (000-1) N-polar c-plane, wherein the surface area of the exposed (000-1) N-polar c-plane is more than 10 mm$^2$ and the total surface area of the exposed {10-10} m-planes is larger than half of the surface area of (000-1) N-polar c-plane.

The polyhedron-shaped GaN bulk crystals are grown in supercritical ammonia by using Ga-containing source materials, typically polycrystalline GaN or metallic Ga. An autoclave, which has a long dimension along the vertical direction, is used to contain supercritical ammonia at temperature(s) of 500° C. or higher and pressure(s) of 1.5 kbar or higher. To hold high-pressure at temperature(s) higher than 300° C., Ni—Cr based superalloy is used as the vessel material.

Figure 1:
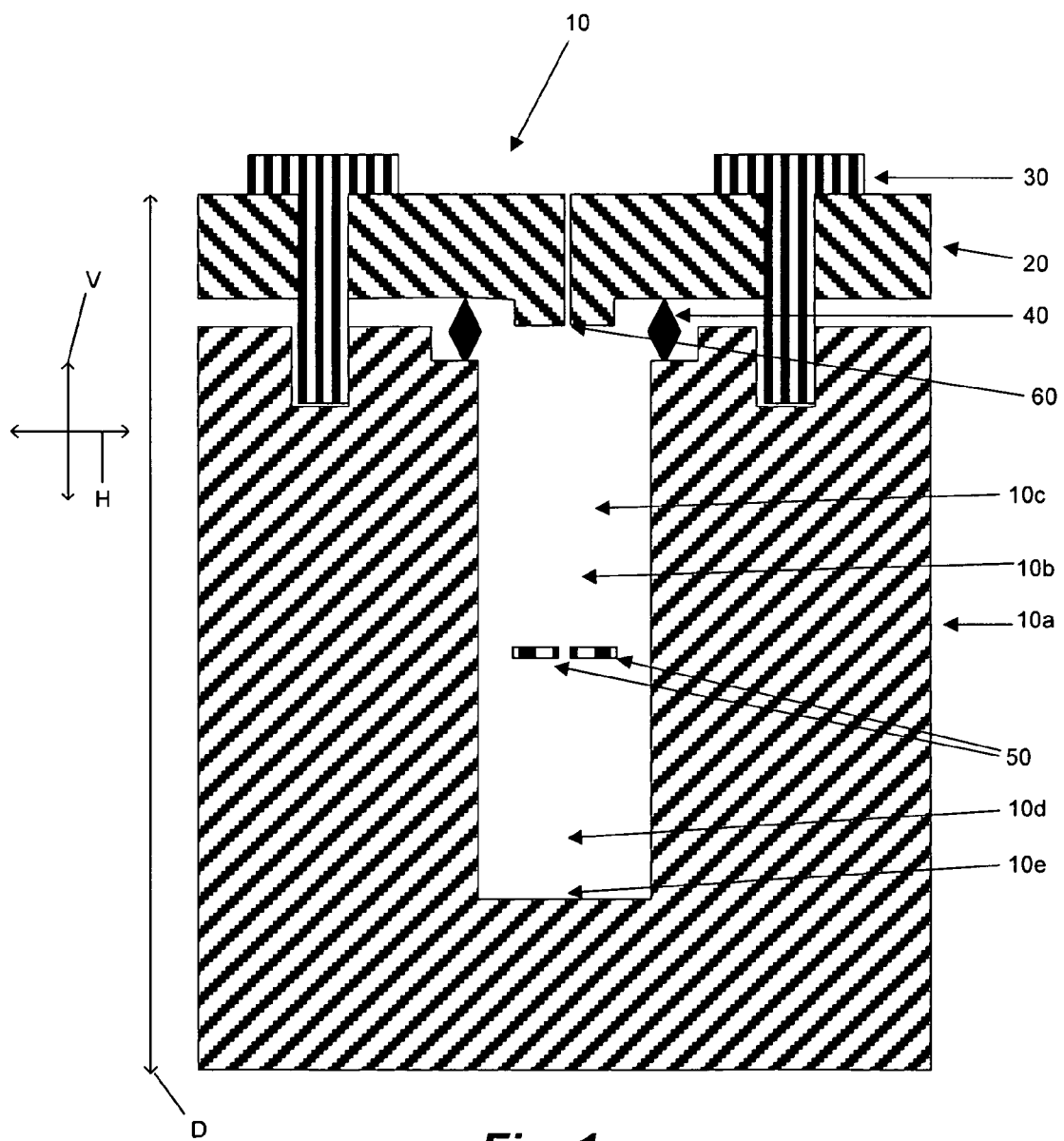
FIG. 1 is a schematic of a high-pressure vessel according to the preferred embodiment of the present invention.

FIG. 1 is a schematic of a high-pressure vessel 10 according to the preferred embodiment of the present invention. The high-pressure vessel 10 comprises an autoclave body 10a (which includes an inner room 10b, an upper region 10c, a lower region 10d, and a bottom 10e), an autoclave lid 20, autoclave screws 30, a gasket 40, one or more baffle plates 50 and an ammonia inlet and outlet port 60. The baffle plates 50 (or flow-restricting plates) divide the inner room 10b of the autoclave body 10a into two regions 10c, 10d along a longitudinal direction H, which are referred to as an upper region 10c and a lower region 10d, and the inner room 10b has a bottom 10e. The autoclave body 10a, the autoclave lid 20, and the autoclave screws 30 may be made of a Ni—Cr based alloy, and have a longest dimension D along a vertical direction V.

Although not shown in FIG. 1, an internal chamber can be used to realize safe operation and pure crystal growth. Since the total volume of the inner room 10b required to grow large GaN crystals is very large, the necessary amount of anhydrous liquid ammonia often exceeds 100 g. By using an internal chamber, one can easily liquefy a large quantity of ammonia in the chamber, avoid moisture contamination, and avoid impurity incorporation into the grown crystals.

A similar structure is disclosed in U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application is incorporated by reference herein.

Figure 2:
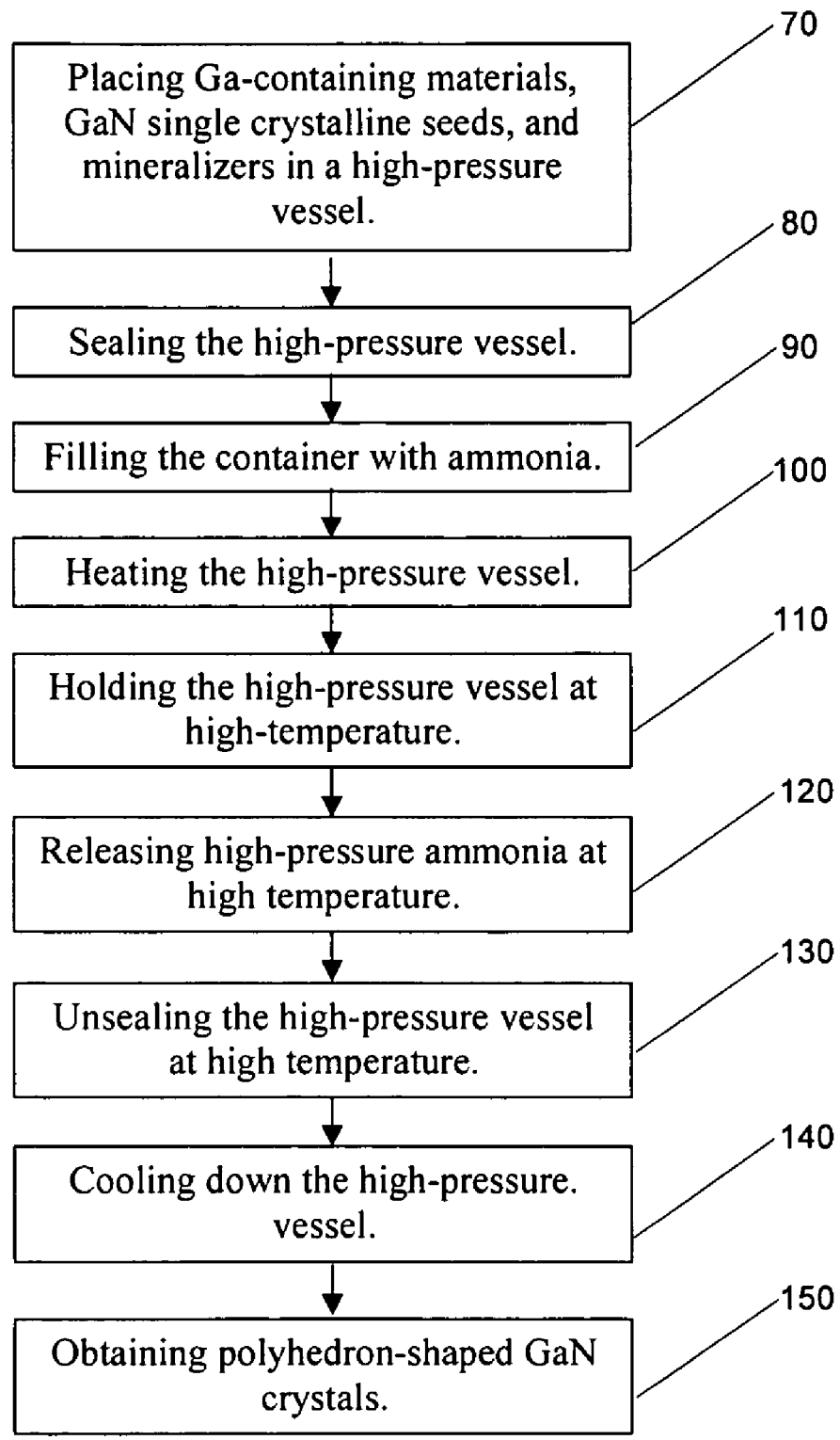
FIG. 2 is a flowchart illustrating the method according to the preferred embodiment of the present invention.

FIG. 2 is a flowchart illustrating the method according to the preferred embodiment of the present invention.

Block 70 represents the step of placing Ga-containing materials, GaN single crystalline seeds, and mineralizers in the autoclave body 10a, wherein the Ga-containing materials are typically loaded in the upper region 10c of the inner room 10b and the GaN seed crystals are typically placed in the lower region 10d of the inner room 10b. Mineralizers containing alkali metal or alkali earth metal are also added in either region 10c or 10d.

Block 80 represents the step of sealing the high-pressure vessel 10, wherein after loading all solid materials in the autoclave body 10a, the autoclave lid 20 of the autoclave body 10a is sealed by tightening the autoclave screws 30.

Block 90 represents the step of filling the container (inner room 10b) with ammonia, wherein ammonia is fed through the ammonia inlet and outlet port 60 of the autoclave body 10a.

After the ammonia charge, the high-pressure vessel 10 is isolated by closing a high-pressure valve (not shown in FIG. 1) connected to the port 60. In this way, all solid materials and ammonia can be loaded into the high-pressure vessel 10 without any oxygen and moisture contamination.

Block 100 represents the step of heating the high pressure vessel 10, wherein the autoclave body 10a is heated with multi-zone heaters to set a temperature difference between the upper region 10c and the lower region 10d. This way, the source materials are dissolved in the supercritical ammonia, transported to the seed crystals, and GaN is crystallized on the seed crystals.

The key feature of the present invention is to set the temperature of the lower region 10d of the inner room 10b at or above 550° C., set the temperature of the upper region 10c of the inner room 10b at or above 500° C., while maintaining the temperature difference between the lower 10d and upper 10c regions at or above 30° C. By setting this sufficiently large temperature difference, a high growth rate of GaN is achieved. Although growth rate on crystallographic facet planes varies depending on growth method and conditions, the present invention has discovered that the ammonothermal method in the examples shown below preferentially produce polyhedron-shaped GaN having m-plane facets.

Block 110 represents the step of holding the high-pressure vessel 10 at high temperature, wherein the high-pressure vessel 10 may be held at these temperatures for 30 days, and more typically, between 60 days and 120 days.

Block 120 represents the step of releasing high-pressure ammonia at high temperature, wherein after the holding step of block 110, the ammonia is released via port 60 at high pressure and high temperature.

The high-pressure vessel 10 can then be unsealed at high temperature, as represented by Block 130, and subsequently cooled down, as represented by Block 140.

The end results obtained by the method are one or more polyhedron shaped GaN crystals, as represented by Block 150. For example, the end result may be a GaN crystal in a polyhedron shape having exposed {10-10} m-planes and an exposed (000-1) N-polar c-plane. A surface area of the exposed (000-1) N-polar c-plane may be more than 10 mm$^2$ and a total surface area of the exposed {10-10} m-planes may be larger than half of the surface area of the (000-1) N-polar c-plane.

Another key feature of the present invention is to use GaN seed crystals which have the longest dimension along the c-axis and exposed large area m-planes, a-planes, other nonpolar planes or semipolar planes. The shape of the seed crystal can be a hexagonal rod, a hexagonal pyramid, m-plane platelet, a-plane platelets, other nonpolar platelets or semipolar platelets.

Since conventional c-plane GaN platelets grown by hydride vapor phase epitaxy (HVPE) have an inherently bent crystallographic lattice, growth on these conventional GaN platelets by the ammonothermal method results in a multiple grain structure. By using seed crystals having the longest dimension along the c-axis, a multiple grain structure is avoided. In addition, since the impurity and defects incorporation is higher for −c plane than +c plane, growth on a c-plane platelet, as is carried out conventionally, results in uneven distribution of impurities/defects along the c-axis (i.e. one side of the crystal has higher impurity/defects density than the other side). By growing on m-plane, a-plane, other nonpolar planes or semipolar planes, GaN crystals with uniform impurity/defect concentration can be obtained.

The rod-shaped, pyramid shaped, or platelet-shaped GaN can be obtained from a spontaneously nucleated crystal using HVPE or other methods such as high-pressure synthesis, flux methods, or the ammonothermal method. Since these spontaneously nucleated crystals are grown without stress, the crystal lattice is not bowed. Therefore, the crystals grown by the ammonothermal method on these seed crystals are not subject to crystallographic lattice bowing.

Experimental Results

Example 1

Run Number THV2008(Not Using an Internal Chamber)

In this example, GaN was grown in a high-pressure vessel comprising an autoclave having an inner diameter of 1 inch, inner height of 10 inches and three baffle plates at the middle height of the chamber. First, 4.377 g of NaNH$_2$ was loaded at the bottom of the autoclave. Then, platelet-shaped c-plane GaN seed crystals (one in a rectangular shape having a longest dimension of about 4.5 mm, and the other in a triangular shape having a longest dimension of about 6 mm) were loaded in the lower region of the autoclave and 30 g of polycrystalline GaN, contained in a Ni—Cr mesh basket, was loaded in the upper region of the autoclave. These solid sources were loaded in a glove box in which the oxygen and moisture concentration is controlled to be less than 1 ppm. After the lid of the autoclave was tightened, 45.7 g of anhydrous liquid ammonia were condensed in the autoclave. The autoclave was heated by the external heater. The lower region was maintained at 575° C. and the upper region was maintained at 510° C. The temperature difference was 65° C. and the resulting maximum pressure was 32,270 psi (2.1 kbar). The autoclave was maintained at high temperature for 82 days and the ammonia was released after 82 days. As soon as the ammonia pressure was released, the screws of the autoclave lid were loosened, and the autoclave was cooled. At room temperature, the autoclave was opened.

Figure 3A:
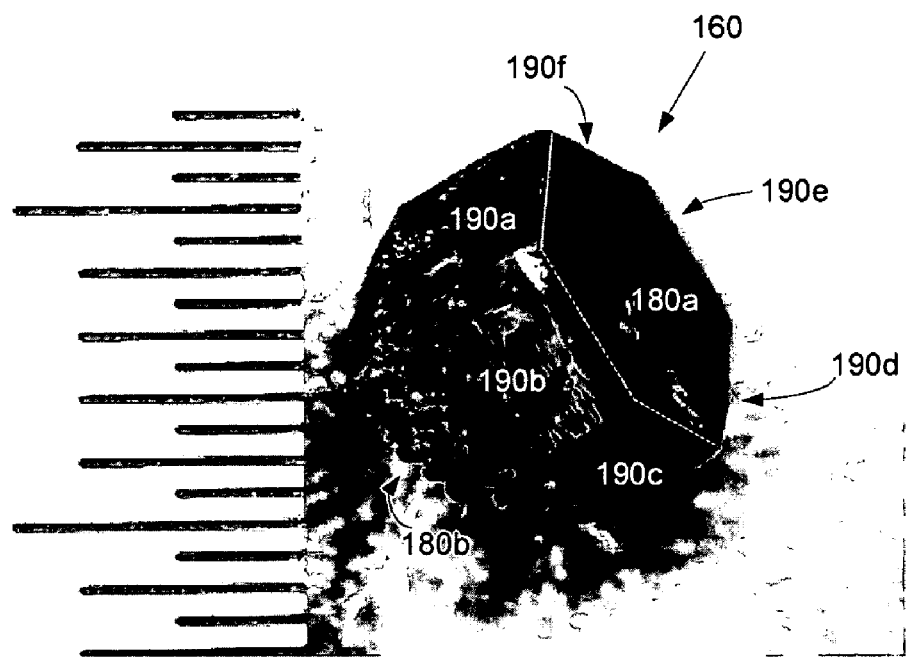
FIG. 3(a) and FIG. 3(b) are photographs of polyhedron-shaped GaN bulk crystals wherein the minimum graduation of the scale shown in FIGS. 3(a) and 3(b) is a half millimeter.
Figure 3B:
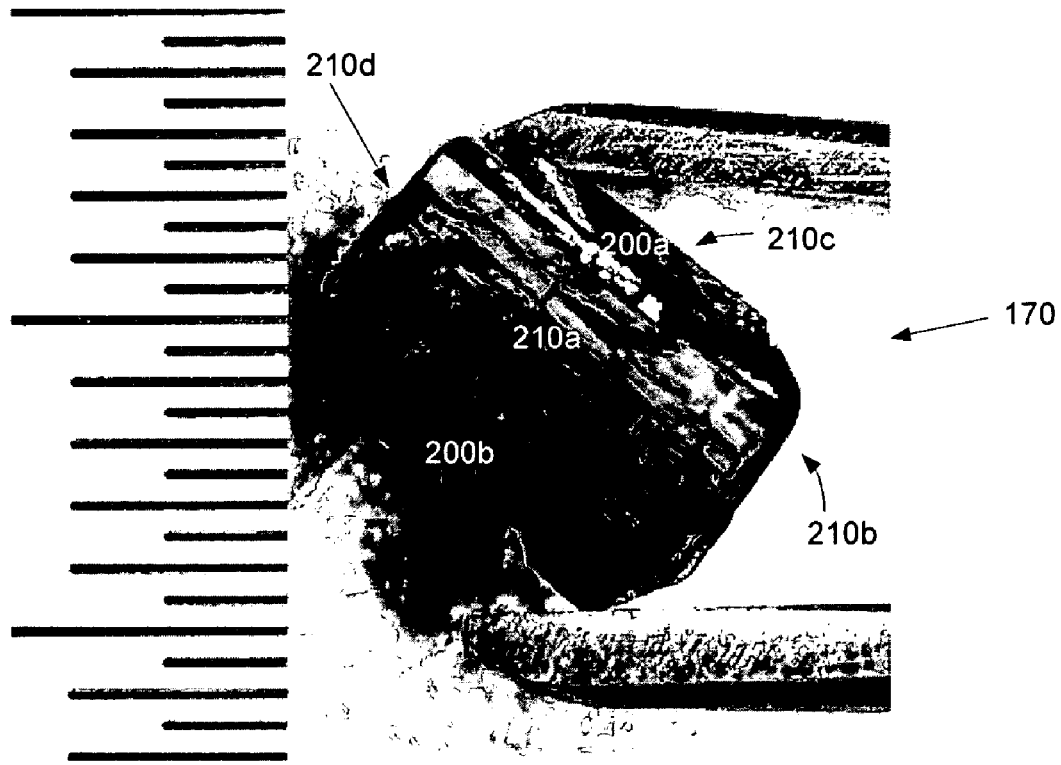
Figure 3C:
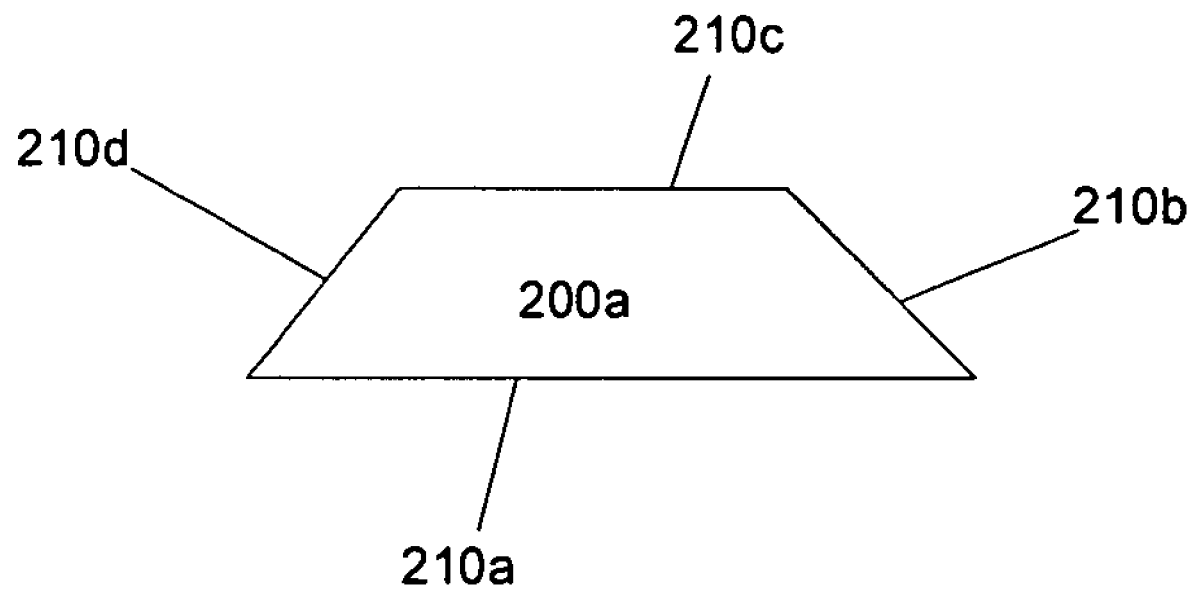
FIG. 3(c) is a schematic top view of the GaN bulk crystal of FIG. 3(b).

The resulting GaN crystals 160 (grown on the rectangular seed crystal), 170 (grown on the triangular seed crystal) having a polyhedron shape are shown in FIGS. 3(a) and 3(b) respectively. FIG. 3(a) shows the crystal 160 comprises a hexagonal bottom or end surface 180a (and may also comprise a hexagonal surface 180b at the opposite end of the crystal 160). The surface 180a is an N-polar (000-1) c-plane and the surface's 180a surface area is approximately 47 mm$^2$. The crystal 160 further comprises sidewalls 190a, 190b, 190c, 190d, 190e and 190f which are exposed m-planes and have a total area of approximately 54 mm$^2$ (i.e. the sum of the areas of surfaces 190a, 190b, 190c, 190d, 190e and 190f is approximately 54 mm$^2$). The total area of exposed m-planes is larger than half of the surface area of N-polar (000-1) surface 180a. FIG. 3(b) shows the crystal 170 comprising a half-hexagonal bottom surface 200a (and may also comprise a half hexagonal top surface 200b). The surface 200a is an N-polar (000-1) c-plane and has a surface area of approximately 42 mm². The crystal 170 further comprises sidewalls 210a, 210b, 210c and 210d which are exposed m-planes and have a total area of approximately 70 mm² (i.e. the sum of the areas of surfaces 210a, 210b and 210d is approximately 70 mm²). The total area of exposed m-planes is larger than half of the surface area N-polar (000-1) plane 200a. These polyhedron-shaped GaN crystals 160, 170 are ready to be cut for substrates having any preferable orientations.

Example 2

Run Number C119(Using an Internal Chamber)

In this example, GaN was grown in a high-pressure vessel comprising an autoclave having an internal chamber. The internal chamber has an inner diameter of 2 inch, an inner height of 10 inches, and three baffle plates at the middle height of the chamber. First, 9.021 g of NaNH₂ was loaded at the bottom of the internal chamber. Then, hexagonal rod-shaped GaN seed crystal (with m-plane exposed, approximately 2 mm of point-to-point dimension for the bottom surface and approximately 3 mm in height) was loaded in the lower region of the internal chamber and 100.7 g of polycrystalline GaN, contained in Ni—Cr mesh basket, was loaded in the upper region of the internal chamber. These solid sources were loaded in a glove box in which the oxygen and moisture concentration was controlled to be less than 1 ppm. After the lid of the internal chamber was tightened, 101.5 g of anhydrous liquid ammonia were condensed in the internal chamber. Then the internal chamber was transferred to an autoclave and the lid was sealed. The autoclave was heated by the external heater. The lower region was maintained at 700° C. and the upper region was maintained at 509° C. Since this autoclave has a thick wall, the temperature difference inside the internal chamber was about 30° C. at most. The resulting maximum pressure was 27,986 psi (2 kbar). The autoclave was maintained at high temperature for 83 days and the ammonia was released after 83 days. As soon as the ammonia pressure was released, the screws of the autoclave lid were loosened, and the autoclave was cooled. At room temperature, the autoclave was opened.

Figure 4:
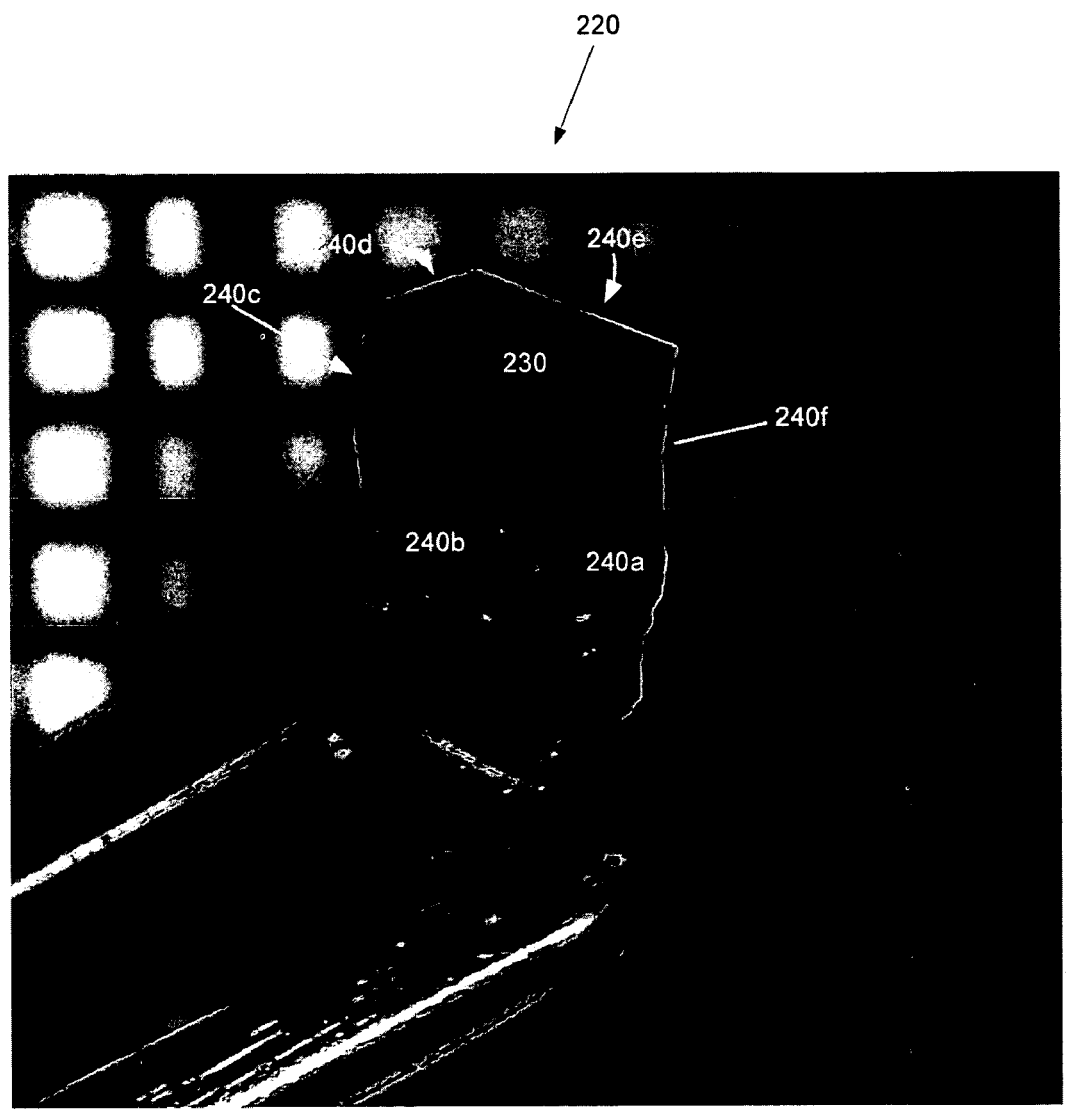
FIG. 4 is a photograph of GaN grown on a hexagonal rod-shaped seed.

The resulting GaN crystal 220 having a polyhedron shape is shown in FIG. 4. As shown in FIG. 4, the bottom N-polar (000-1) c-plane surface 230 has a darker color than the m-plane sidewall(s) 240a, 240b, 240c, 240d, 240e, and 240f. Since the origin of the color is thought to be due to impurities and defects, this result demonstrates that growth on an m-plane sidewall 240a, 240b, 240c, 240d, 240e, or 240f involves less impurity and/or defect incorporation. Also, if this crystal 220 is grown to a larger size, much less grain structures than crystals grown into conventional c-plane platelets can be obtained.

Example 3

Wafers Sliced from THV2008

Figure 6A:
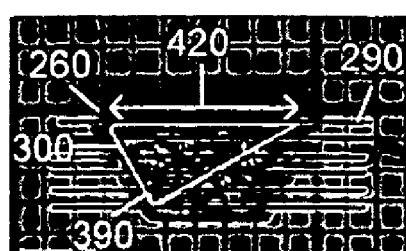
FIG. 6(a) is a top view of a GaN boule before slicing, and the parallel lines and trapezoid represent approximate wire saw position and position of seed crystal, respectively.
Figure 6B:
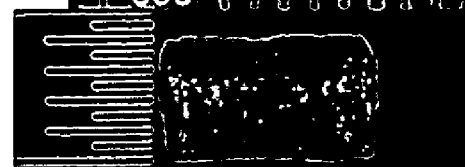
FIGS. 6(b)-(h) are photographs of m-plane wafers sliced from the GaN boule shown in FIG. 6(a), wherein the minimum graduation of the scale shown in FIGS. 6(b)-(h) is a half millimeter.
Figure 6C:
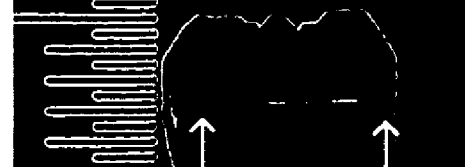
Figure 6D:
Figure 6E:
Figure 6F:
Figure 6G:
Figure 6H:

In this example, the grown GaN boules 250 and 260 shown in FIGS. 5(a) and 6(a) were sliced with a wire saw. The dimension of the grid in FIGS. 5(a) and 6(a) is 1 mm. FIG. 5(b), FIG. 5(c), FIG. 5(d), and FIG. 5(e) show c-plane wafers and FIG. 6(b), FIG. 6(c), FIG. 6(d), FIG. 6(e), FIG. 6(f), FIG. 6(g), and FIG. 6(h) show m-plane wafers. This example demonstrates the ease of fabricating wafers with any favorable orientations.

In FIG. 5(a), the parallel lines 270 represent approximate wire saw positions to cut the slices shown in FIG. 5(b), FIG. 5(c), FIG. 5(d), and FIG. 5(e), wherein the slices of FIG. 5(b), FIG. 5(c), FIG. 5(d), and FIG. 5(e) correspond to the ordering of parallel lines 270 from top to bottom. The rectangle 280 in FIG. 5(a) shows the position of the seed crystal for the growth of the boule 250.

In FIG. 6(a), the parallel lines 290 represent approximate wire saw position to cut the slices of FIG. 6(b), FIG. 6(c), FIG. 6(d), FIG. 6(e), FIG. 6(f), FIG. 6(g), and FIG. 6(h), wherein the slices of FIG. 6(b), FIG. 6(c), FIG. 6(d), FIG. 6(e), FIG. 6(f), FIG. 6(g), and FIG. 6(h) correspond to the ordering of parallel lines 290 from top to bottom. The trapezoid 300 in FIG. 6(a) shows the position (i.e. outline) of the seed crystal for the growth of the boule 260. The single headed white arrows in FIGS. 6(b)-(h) represent the lateral boundary between the seed crystal and the crystal 260 grown by the ammonothermal method.

In addition, analysis of the slice of FIG. 5(b) shows that growth along the a-direction is much faster than growth along the m-direction, and the domain growing along the a-direction is much more transparent than the domains growing along the +c or −c directions. Therefore, it is advantageous to use a-plane seed crystals to grow polyhedron GaN.

Seed Crystals

FIGS. 7(a), 7(b) and 7(c) illustrate various shapes for seed crystals. FIG. 7(a) illustrates a rectangular seed crystal wafer 310 comprising rectangular-shape 320 surface 330, rectangular shape surface 340, rectangular shape 350 surface 360, and longest dimension 370, as used to grow the crystal 160 of FIG. 3(a). In Example 1, the longest dimension 370 is approximately 4.5 mm. The slices shown in FIG. 5(b)-(e) are parallel to the surface 330 of the seed crystal 310, and illustrate the rectangular shape 320 and longest dimension 370. The rectangle 350 in FIG. 5(a) shows the perimeter of surface 360. If surface 330 is c-plane, then surface 360 is m-plane and surface 340 is a-plane.

FIG. 7(b) illustrates a seed crystal wafer 380 with triangular-shape 390 surface 400, surface 410, and longest dimension 420, as used to grow the crystal 170 of FIG. 3(b). In Example 1, the longest dimension 420 is 6 mm. The triangular shape 390, and the longest dimension 420, are also illustrated in FIG. 6(a). In Example 1, surface 410 is a m-plane, and the trapezoid 300 of FIG. 6(a) outlines a surface parallel to an a-plane, surface 410 (m-plane) and another m-plane (i.e. the plane of the paper in FIG. 6(a) is c-plane).

FIG. 7(c) illustrates a hexagonal rod-shaped seed crystal 430 with exposed m-plane 440a, 440b, 440c surfaces, point 450a-to-point 450b dimension 460 for the polyhedron shaped (e.g. hexagonal) bottom surface 470, and height 480. The crystal 220 in FIG. 4 is grown on a seed 430 with dimension 460 of 2 mm and height 480 of 3 mm.

Thus, the GaN crystal 160, 170, 220 may be grown, for example, on a seed crystal and the seed crystal may be a wafer 310 or 380 or a rod-shaped gallium nitride crystal 430 having its longest dimension 480 along a c-axis. The wafer 310, 380 may be an a-plane oriented GaN wafer (wherein, for example, the largest surface 330, 400 of the wafer 310, 380 is an a-plane), an m-plane oriented GaN wafer (wherein, for example, the largest surface 330, 400 of the wafer 310, 380 is an m-plane), a c-plane oriented GaN wafer (wherein, for example, the largest surface 330, 400 of the wafer 310, 380 is an c-plane). The a-plane oriented seed crystal 310, 380 may be obtained by slicing a GaN boule (e.g. 160, 170) grown by an ammonothermal method, for example.

The crystal 160, 170, 220 may grow on all surfaces of a seed crystal 310, 380, 430, so as to encapsulate or surround the seed crystal 310, 380, 430. For example, the crystal may grow on the a-plane surface of the seed crystal, the m-plane surface of the seed crystal, and the c-plane surface of the seed crystal. Typically more crystal is grown on an a-plane surface of the seed crystal than an m-plane surface of the seed crystal, however, because a-plane grows faster than m-plane.

Possible Modifications and Variations

Although polycrystalline GaN was used as a source material in the examples, the same effect may be obtained using Ga metal, amorphous GaN, or other Ga containing materials as source materials.

Although $NaNH_2$ was presented in the examples, the same effect can be achieved using an alkali-base mineralizer such as $KNH_2$, $NaNH_2$, $LiNH_2$, K, Na, Li, $Ca(NH_2)_2$, $Mg(NH_2)_2$, $Ba(NH_2)_2$, $Ca_3N_2$, $Mg_3N_2$, $MgCl_2$, $CaCl_2$, $MgBr_2$, $CaBr_2$, $MgI_2$, $CaI_2$, Mg, Ca, or similar alkali metal, or alkali earth metal containing substance(s).

This method can be used for growing other III-nitrides such as AlN and InN.

Advantages and Improvements over Existing Practice

The existing methods limit the shape of the GaN crystal to a platelet. The present invention discloses GaN bulk crystals 160 in a polyhedron shape having exposed {10-10} m-planes 190a-c and an exposed (000-1) N-polar c-plane 180a, wherein the surface area of the exposed (000-1) N-polar c-plane 180a is more than 10 mm$^2$ and the total surface area of all the exposed {10-10} m-planes 190a, 190b, 190c, 190d, 190e and 190f is larger than half of the surface area of (000-1) N-polar c-plane 180a. This shape of GaN crystals has an advantage over the existing platelet-shaped GaN since GaN wafers of any preferable orientations can be obtained simply by slicing the polyhedron. The GaN bulk crystals were grown by the ammonothermal method with higher temperature and temperature difference than is used conventionally.

REFERENCES

The following references are incorporated by reference herein.

1. S. Porowski, MRS Internet Journal of Nitride Semiconductor, Res. 4S1, (1999) G1.3.
2. T. Inoue, Y. Seki, O. Oda, S. Kurai, Y. Yamada, and T. Taguchi, Phys. Stat. Sol. (b) 223 (2001) p. 15.
3. M. Aoki, H. Yamane, M. Shimada, S. Sarayama, and F. J. DiSalvo, J. Cryst. Growth 242 (2002) p. 70.
4. T. Iwahashi, F. Kawamura, M. Morishita, Y. Kai, M. Yoshimura, Y. Mori, and T. Sasaki, J. Cryst Growth 253 (2003) p. 1.
5. D. Peters, J. Cryst. Growth 104 (1990) pp. 411-418.
6. R. Dwilinski, R. Doradzinski, J. Garczynski, L. Sierzputowski, J. M. Baranowski, M. Kaminska, Diamond and Related Mat. 7 (1998) pp. 1348-1350.
7. R. Dwilinski, R. Doradzinski, J. Garczynski, L. Sierzputowski, M. Palczewska, Andrzej Wysmolek, M. Kaminska, MRS Internet Journal of Nitride Semiconductor, Res. 3 25(1998).
8. Douglas R. Ketchum, Joseph W. Kolis, J. Cryst. Growth 222 (2001) pp. 431-434.
9. U.S. Pat. No. 6,656,615, issued Dec. 2, 2003, to R. Dwilinski, R. Doradzinski, J. Garczynski, L. Sierzputowski and Y. Kanbara, and entitled "Bulk monocrystalline gallium nitride."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A gallium nitride crystal having a polyhedron shape with exposed {10-10} m-planes and an exposed (000-1) N-polar c-plane, wherein a surface area of the exposed (000-1) N-polar c-plane is more than 10 mm$^2$ and a total surface area of the exposed {10-10} m-planes is larger than half of the surface area of the exposed (000-1) N-polar c-plane.

2. The gallium nitride crystal of claim 1, wherein the crystal is grown in supercritical ammonia.

3. The gallium nitride crystal of claim 2, wherein the crystal is grown on a seed crystal and the seed crystal is an a-plane oriented gallium nitride wafer.

4. The gallium nitride crystal of claim 3, wherein the a-plane oriented seed crystal is obtained by slicing a GaN boule grown by an ammonothermal method.

5. The gallium nitride crystal of claim 2, wherein the crystal is grown on a seed crystal and the seed crystal is an m-plane oriented gallium nitride wafer.

6. The gallium nitride crystal of claim 2, wherein the crystal is grown on a seed crystal and the seed crystal is a c-plane oriented gallium nitride wafer.

7. The gallium nitride crystal of claim 2, wherein the crystal is grown on a rod-shaped gallium nitride crystal having its longest dimension along a c-axis.

8. A gallium nitride wafer sliced from the crystal of claim 1.

9. A method for growing gallium nitride (GaN) crystals in a high-pressure vessel, comprising:
   heating a lower region of an inner room in the high-pressure vessel at or above 550° C., and heating an upper region of the inner room at or above 500° C., while maintaining a temperature difference between the lower region and upper region at or above 30° C.,
   wherein the gallium nitride (GaN) crystals have exposed {10-10} m-planes and an exposed (000-1) N-polar c-plane, and a surface area of the exposed (000-1) N-polar c-plane is more than 10 mm$^2$, and a total surface area of the exposed {10--10} m-planes is larger than half of the surface area of the exposed (000-1) N-polar c-plane.

10. The method of claim 9, further comprising:
   (a) loading alkali-based mineralizers at a bottom of a high-pressure vessel, GaN single crystalline seeds in the lower region of the high-pressure vessel, and Ga-containing materials in the upper region of the high pressure vessel;
   (b) filling the high-pressure vessel with ammonia;
   (c) sealing the high-pressure vessel;
   (d) heating the lower region of the high-pressure vessel with an external heater at or above 550° C., heating the upper region of the high-pressure vessel with external heat at or above 500° C., while maintaining the temperature difference between the lower region and upper region at or above 30° C.;
   (e) holding the lower region at or above at or above 550° C., holding the upper region at or above 500° C., and maintaining the temperature difference, for more than 30 days;
   (f) releasing high-pressure ammonia at a temperature higher than 300° C.;
   (g) unsealing the high-pressure vessel at a temperature higher than 300° C.; and
   (h) cooling down the high-pressure vessel; and (i) wherein the high-pressure vessel is made of a Ni—Cr based alloy, has a longest dimension along a vertical direction, and has flow-restricting plates to divide an inner room of the high-pressure vessel into the upper region and the lower region.

11. The method of claim 10, wherein the GaN single crystalline seeds have a-plane orientation and are sliced from a GaN crystal grown by an ammonothermal method.

12. A gallium nitride (GaN) crystal having a polyhedron shape with exposed {10--10} m-planes and an exposed (000-1) N-polar c-plane grown by a method comprising:
  (a) loading alkali-based mineralizers at a bottom of a high-pressure vessel, GaN single crystalline seeds in the lower region of the high-pressure vessel, and Ga-containing materials in the upper region of the high pressure vessel;
  (b) filling the high-pressure vessel with ammonia;
  (c) sealing the high-pressure vessel;
  (d) heating the lower region of the high-pressure vessel with an external heater at or above 550° C., heating the upper region of the high-pressure vessel with external heat at or above 500° C., while maintaining the temperature difference between the lower region and upper region at or above 30° C.;
  (e) holding the lower region at or above at or above 550° C., holding the upper region at or above 500° C., and maintaining the temperature difference, for more than 30 days;
  (f) releasing high-pressure ammonia at a temperature higher than 300° C.;
  (g) unsealing the high-pressure vessel at a temperature higher than 300° C.; and
  (h) cooling down the high-pressure vessel; and
  (i) wherein the high-pressure vessel is made of a Ni—Cr based alloy, has a longest dimension along a vertical direction, and has flow-restricting plates to divide an inner room of the high-pressure vessel into the upper region and the lower region,
  (j) wherein a surface area of the exposed (000-1) N-polar c-plane is more than 10 mm$^2$, and a total surface area of the exposed {10--10} m-planes is larger than half of the surface area of the exposed (000-1) N-polar c-plane.

13. The GaN crystal of claim 12, wherein the GaN single crystalline seeds have a-plane orientation and are sliced from a GaN crystal grown by an ammonothermal method.

* * * * *